(12) United States Patent
Nakamoto et al.

(10) Patent No.: US 9,701,207 B2
(45) Date of Patent: Jul. 11, 2017

(54) ELECTRIC STORAGE APPARATUS

(71) Applicant: GS Yuasa International Ltd.,
Kyoto-shi (JP)

(72) Inventors: Takeshi Nakamoto, Kyoto (JP);
Takeyuki Shiraishi, Kyoto (JP)

(73) Assignee: GS YUASA INTERNATIONAL LTD.,
Kyoto-Shi, Kyoto (JP)

( * ) Notice: Subject to any disclaimer, the term of this patent is extended or adjusted under 35 U.S.C. 154(b) by 0 days.

(21) Appl. No.: 15/268,283

(22) Filed: Sep. 16, 2016

(65) Prior Publication Data

US 2017/0001525 A1 Jan. 5, 2017

Related U.S. Application Data

(63) Continuation of application No. 14/816,769, filed on Aug. 3, 2015, now Pat. No. 9,463,699, which is a
(Continued)

(30) Foreign Application Priority Data

Oct. 11, 2012 (JP) .................................. 2012-225832
Sep. 11, 2013 (JP) .................................. 2013-187835

(51) Int. Cl.
*H02H 3/00* (2006.01)
*B60L 11/02* (2006.01)
(Continued)

(52) U.S. Cl.
CPC .............. *B60L 11/02* (2013.01); *B60L 11/18* (2013.01); *B60L 11/1862* (2013.01);
(Continued)

(58) Field of Classification Search
CPC ...................................................... H01H 47/22
(Continued)

(56) References Cited

U.S. PATENT DOCUMENTS 5,327,068 A   7/1994  Lendrum et al.
5,332,958 A   7/1994  Sloan
(Continued)

FOREIGN PATENT DOCUMENTS

CN         1305912 A      8/2001
DE      43 37 792 A1      5/1995
(Continued)

OTHER PUBLICATIONS

European Search Report dated Aug. 26, 2014.
(Continued)

*Primary Examiner* — Stephen W Jackson
(74) *Attorney, Agent, or Firm* — McGinn IP Law Group, PLLC.

(57) ABSTRACT

A battery including an output terminal, an electric storage device, a monitoring apparatus including a detector and a controller, the detector being configured to detect a variation value corresponding to an amount of charge of the electric storage device, a relay connected to the output terminal and the electric storage device, and a communication unit connected to the controller. The controller is configured to execute an opening process to switch a state of the relay from a closed state to an open state and to cause the communication unit to receive an input signal from outside.

20 Claims, 3 Drawing Sheets

Related U.S. Application Data continuation of application No. 14/048,789, filed on Oct. 8, 2013, now Pat. No. 9,165,736.

(51) Int. Cl.

| | |
|---|---|
| *G01R 31/36* | (2006.01) |
| *B60L 11/18* | (2006.01) |
| *H01M 10/42* | (2006.01) |
| *H02J 7/00* | (2006.01) |
| *H01H 47/22* | (2006.01) |
| *H02J 7/14* | (2006.01) |
| *H02J 9/00* | (2006.01) |
| *G01R 31/00* | (2006.01) |
| *H01M 4/58* | (2010.01) |
| *H01M 4/587* | (2010.01) |
| *H01M 10/0525* | (2010.01) |
| *H01M 10/48* | (2006.01) |

(52) U.S. Cl.
CPC ....... *G01R 31/005* (2013.01); *G01R 31/3606* (2013.01); *G01R 31/3624* (2013.01); *G01R 31/3675* (2013.01); *H01H 47/22* (2013.01); *H01M 4/587* (2013.01); *H01M 4/5825* (2013.01); *H01M 10/0525* (2013.01); *H01M 10/42* (2013.01); *H01M 10/486* (2013.01); *H02J 7/0016* (2013.01); *H02J 7/0021* (2013.01); *H02J 7/0022* (2013.01); *H02J 7/0026* (2013.01); *H02J 7/14* (2013.01); *H02J 9/005* (2013.01); *H01M 2010/4271* (2013.01); *H01M 2220/20* (2013.01); *H02J 2007/0095* (2013.01); *Y02T 10/7011* (2013.01); *Y02T 10/7016* (2013.01); *Y02T 10/7055* (2013.01)

(58) Field of Classification Search
USPC ........................................................ 361/90
See application file for complete search history.

(56) References Cited

U.S. PATENT DOCUMENTS

| | | | |
|---|---|---|---|
| 5,343,077 A | | 8/1994 | Yoshida et al. |
| 5,343,351 A | * | 8/1994 | Quantz ................ F02N 11/087 361/18 |
| 5,381,295 A | | 1/1995 | Rund et al. |
| 6,400,589 B2 | | 6/2002 | Abo et al. |
| 6,712,923 B2 | | 3/2004 | Tanaka |
| 7,146,959 B2 | | 12/2006 | Thompson et al. |
| 7,477,038 B2 | | 1/2009 | Taniguchi |
| 7,583,053 B2 | | 9/2009 | Kamohara |
| 9,165,736 B2 | * | 10/2015 | Nakamoto ............ H01M 10/42 |
| 9,463,699 B2 | * | 10/2016 | Nakamoto ............ H01M 10/42 |
| 2009/0147427 A1 | | 6/2009 | Levinas et al. |
| 2009/0184578 A1 | | 7/2009 | Owens |
| 2010/0019725 A1 | | 1/2010 | Nakatsuji |
| 2010/0082198 A1 | | 4/2010 | Arai et al. |
| 2011/0257825 A1 | | 10/2011 | Yamamoto et al. |
| 2013/0106356 A1 | | 5/2013 | Nakao et al. |

FOREIGN PATENT DOCUMENTS

| | | |
|---|---|---|
| DE | 199 41 513 A1 | 3/2001 |
| EP | 0 964 470 B1 | 3/2011 |
| EP | 2479819 A2 | 7/2012 |
| JP | H 10-322930 A | 12/1998 |
| JP | 2006-327487 A | 12/2006 |
| JP | 2007-078443 A | 3/2007 |
| JP | 2008-154317 A | 7/2008 |
| JP | 2010-220380 A | 9/2010 |
| JP | 2011-115012 A | 6/2011 |
| JP | 4693290 B2 | 6/2011 |
| JP | 4693291 B2 | 6/2011 |
| JP | 2012-10563 A | 1/2012 |
| JP | 4875368 B2 | 2/2012 |
| WO | WO 2010/050040 A1 | 5/2010 |

OTHER PUBLICATIONS

U.S. Office Action dated Mar. 26, 2015 in U.S. Appl. No. 14/048,789.
U.S. Notice of Allowance dated Jun. 18, 2015 in U.S. Appl. No. 14/048,789.
U.S. Office Action dated Feb. 24, 2016 in U.S. Appl. No. 14/816,769.
U.S. Notice of Allowance dated Jun. 15, 2016 in U.S. Appl. No. 14/816,769.

* cited by examiner

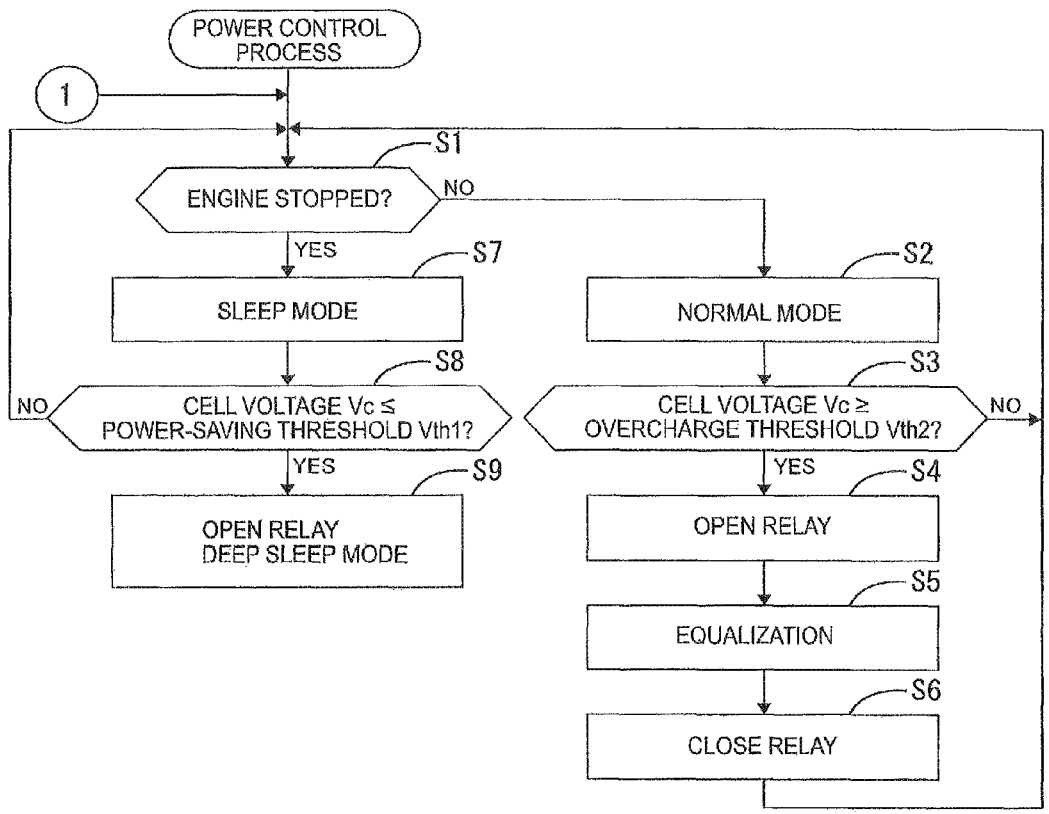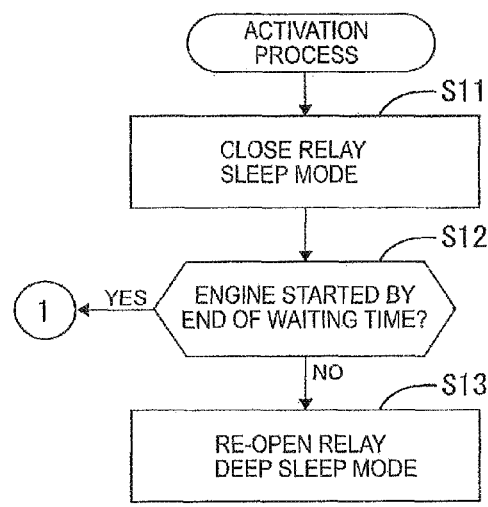

ELECTRIC STORAGE APPARATUS

The present application is a Continuation Application of U.S. patent application Ser. No. 14/816,769, filed on Aug. 3, 2015, which is a Continuation Application of U.S. patent application Ser. No. 14/048,789, filed on Oct. 8, 2013, now U.S. Pat. No. 9,165,736 B2, issued on Oct. 20, 2015, which is based on and claims priority from Japanese Patent Application No. 2012-225832, filed on Oct. 11, 2012 and Japanese Patent Application No. 2013-187835, filed on Sep. 11, 2013, the entire contents of which are incorporated herein by reference.

FIELD

The present invention relates to a technology for reducing power consumption in an electric storage apparatus while power supply to an electric load is halted.

BACKGROUND

A battery is installed in a vehicle for supplying power to a starter to start an engine. The battery may also be used as a power source for supplying power to various on-vehicle devices. The battery is charged by an electric generator when the engine is running, for example, during driving. In contrast, the battery is not charged when the engine is stopped. A state of charge of the battery decreases if the power is being supplied to the on-vehicle devices or a dark current exists. The state of charge of the battery may decrease to a level at which the engine cannot be started, i.e., the battery may run out.

There is a known technology (for example, JP-A-2006-327487) for shutting down a power supply route for supplying power to an on-vehicle device, which consumes a dark current, when a battery voltage of a vehicle, the engine of which has stopped, reaches a predetermined value.

SUMMARY

The following presents a simplified summary of the invention disclosed herein in order to provide a basic understanding of some aspects of the invention. This summary is not an extensive overview of the invention. It is intended to neither identify key or critical elements of the invention nor delineate the scope of the invention. Its sole purpose is to present some concepts of the invention in a simplified form as a prelude to the more detailed description that is presented later.

In a known technology, a relay that shuts down the power supply route for supplying power is provided outside the battery. A system outside the battery is configured to monitor the battery voltage and shut down the relay based on the result of the monitoring. In other words, in the known technology, the system outside the battery is required to shut down the relay, and thus a communication means between the battery and the system outside the battery is necessary. This is an example of disadvantages of the known technology.

This specification describes a technology in which the electric storage apparatus itself controls the amount of charge thereof independently from a system outside the electric storage apparatus so as not to decrease to the level at which the engine cannot be started.

An electric storage apparatus described herein includes an output terminal configured to be electrically connected to a system including an engine, an electric storage device, a monitoring apparatus including a detector and a controller, and a relay disposed between the output terminal and the electric storage device. The detector is configured to detect a variation value corresponding to an amount of charge of the electric storage device. The controller is configured to determine whether the variation value detected by the detector is equal to or lower than an opening threshold, and execute an opening process to switch a state of the relay from a closed state to an open state if the variation value is equal to or lower than the opening threshold. The opening threshold is larger than an engine activation low-threshold by a predetermined value. The engine activation low-threshold is a lowest level of the amount of charge at which the engine is able to be started.

BRIEF DESCRIPTION OF DRAWINGS

The foregoing and other features of the present invention will become apparent from the following description and drawings of an illustrative embodiment of the invention in which:

FIG. 2A is a flowchart of a power control process;
FIG. 2B is a flowchart of an activation process.

DESCRIPTION OF EMBODIMENTS

Figure 1:
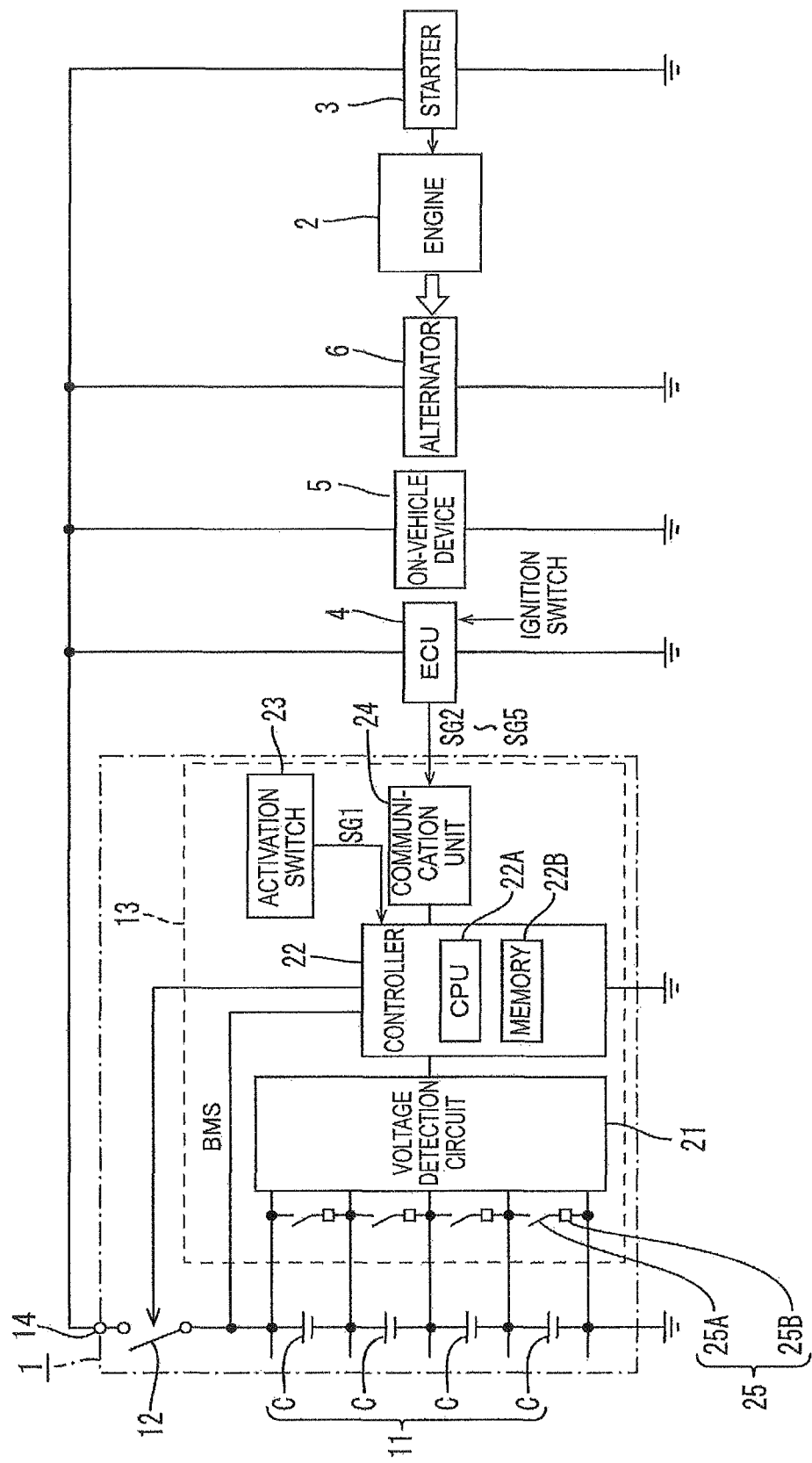
FIG. 1 is a configuration diagram of a battery according to an embodiment, an on-vehicle device, and other devices.

According to a first aspect of the present invention, an electric storage apparatus includes an output terminal to be electrically connected to a system including an engine, an electric storage device, a monitoring apparatus including a detector and a controller, and a relay disposed between the output terminal and the electric storage device. The detector is configured to detect a variation value corresponding to an amount of charge of the electric storage device. The controller is configured to determine whether the variation value detected by the detector is equal to or lower than an opening threshold, and execute an opening process to switch a state of the relay from a closed state to an open state if the variation value is equal to or lower than the opening threshold. The opening threshold is larger than an engine activation low-threshold by a predetermined value. The engine activation low-threshold is a lowest level of the amount of charge at which the engine is able to be started.

The electric storage apparatus according to this aspect includes the relay. The relay in the closed state is switched to the open state when the controller determines that the variation value corresponding to the amount of charge of the electric storage device is equal to or lower than the opening threshold. With this configuration, the electric storage apparatus itself can control the amount of charge thereof independently from a system outside the electric storage apparatus so as not to decrease to the level at which the engine cannot be started.

According to a second aspect of the present invention, in the above-described electric storage apparatus, the controller is further configured to switch a power consumption mode of the monitoring apparatus between a first power consumption mode, in which the monitoring apparatus monitors the electric storage device, and a second power consumption mode, in which the monitoring apparatus consumes less power supplied from the electric storage device than in the first power consumption mode, determine whether the variation value detected by the detector is lower than a low power threshold, and execute a power saving process to switch the power consumption mode of the monitoring apparatus from the first power consumption mode to the second consumption state if the variation value is equal to or lower than the low power threshold. In the first power consumption mode, the monitoring apparatus monitors the electric storage device. In the second power consumption mode, the monitoring apparatus consumes less power supplied from the electric storage device than in the second power consumption mode. With this configuration, the monitoring apparatus consumes less power of the electric storage device.

According to a third aspect of the present invention, the above-described electric storage apparatus further includes a receiver that is configured to receive a return instruction based on an external input. The controller is configured to execute a return process to switch the power consumption mode of the monitoring apparatus from the second power consumption mode back to the first power consumption mode if the receiver receives the return instruction. With this configuration, the monitoring apparatus can monitor the electric storage device again.

According to a fourth aspect of the present invention, in the above-described electric storage apparatus, the controller is configured to execute a closing process to switch the state of the relay from the open state back to the closed state if the controller executes the return process to switch the power consumption mode of the monitoring apparatus back to the first power consumption mode. With this configuration, the power of the electric storage device can be supplied to the engine again.

According to a fifth aspect of the present invention, in the above-described electric storage apparatus, the controller is configured to determine whether the engine is started in a period between when the state of the relay is switched back to the closed state and when reference closing time is completed, and execute a re-opening process to switch the state of the relay from the closed state to the open state again if the start of the engine is not determined.

The charge of the electric storage device starts when the engine is started. However, if a condition in which the engine is not started continues after the state of the relay is switched back to the closed state, the power provided by the electric storage device is consumed by the electric load because the relay is in the closed state, and thus the amount of charge of the electric storage device decreases to the level at which the engine cannot be started. To solve this problem, in the electric storage apparatus, the state of the relay is switched back to the open state if the controller determines that the engine is not started in the period between when the state of the relay is switched back to the closed state and when the reference closing time is completed. With this configuration, the power provided by the electric storage device is less likely to be continuously consumed by the electric load because the relay does not remain in the closed state for a long time while the engine is not started after the relay is switched back to the closed state.

According to a sixth aspect of the present invention, in the above-described electric storage apparatus, the controller is further configured to determine whether the engine is started in a period between when the power consumption mode is switched back to the first power consumption mode and when reference power time is completed, and execute a re-power saving process to switch the power consumption mode of the monitoring apparatus back to the second power consumption mode if the start of the engine is not determined. In this configuration, a condition in which the engine is not started for a long time after the power consumption mode of the monitoring apparatus is back in the first power consumption mode does not continue, and thus the power of the electric storage device may not be consumed by the controller in the first power consumption mode.

According to a seventh aspect of the present invention, in the above-described electric storage apparatus, the controller is configured to determine whether a voltage of the electric storage device exceeds an overcharge threshold based on the variation value detected by the detector, and execute an overcharge protection process to switch the state of the relay from the closed state to the open state if the voltage of the electric storage device exceeds the overcharge threshold. With this configuration, the relay can be used to prevent overcharge.

The technologies described herein can be used in various applications including an electric storage apparatus, a power control method of an electric storage apparatus, a computer program for executing the function of the apparatus or the method, or a recording medium that stores the computer program.

According to the technology described herein, the electric storage apparatus is configured to control the amount of charge thereof independently from a system outside the electric storage apparatus so as not to decrease to the level at which the engine cannot be started.

An embodiment will be described with reference to FIG. 1 to FIG. 3.

As illustrated in FIG. 1, a battery 1 according to this embodiment is a starter battery that supplies power to a starter 3 to start an engine 2. The battery 1 is installed in a vehicle such as an engine vehicle or a hybrid vehicle. The battery 1 also supplies power to an engine control unit (hereinafter, referred to as an ECU) 4, and an on-vehicle device 5 such as a clock, a light, an audio system, or a security system. The battery 1 is charged by an alternator 6 that generates power using the rotation of the engine 2. The battery 1 is an example of an electric storage apparatus. The ECU 4 or the on-vehicle device 5 is an example of an electric load.

Configuration of Battery

The battery 1 includes an assembled battery 11, a relay 12, a battery management system (hereinafter, referred to as BMS) 13, and an output terminal 14. The assembled battery 11 is an example of an electric storage device. The assembled battery 11 includes cells C that are connected in series. The cell C is a secondary battery that is rechargeable, specifically, an iron phosphate lithium ion battery that has a graphite anode. In FIG. 1 and the description below, the assembled battery 11 includes four cells C.

The starter 3, the ECU 4, the on-vehicle device 5, and the alternator 6 are electrically connected to the output terminal 14. The relay 12 is provided inside the battery 1 and is connected between the assembled battery 11 and the output terminal 14. The state of the relay 12 is switched between an open state and a closed state by an opening or closing control of a controller 22, which will be described later. The relay 12 is a latching relay. Once the relay 12 is set in the open state or the closed state through an instruction from the controller 22, the open state or the closed state is maintained even when the power supply is stopped. In the closed state of the relay 12, the battery 1 can supply power to the starter 3, the ECU 4, or the on-vehicle device 5, and the battery 1 can be charged by the alternator 6. In the open state of the relay 12, the battery 1 cannot supply power to the starter 3 and the others, and the battery 1 cannot be charged by the alternator 6.

The BMS 13 includes a voltage detection circuit 21, the controller 22, an activation switch 23, a communication unit 24, and four equalization circuits (discharge circuits) 25. The BMS 13 is an example of a monitoring apparatus. The voltage detection circuit 21 is an example of a detector. The voltage detection circuit 21 detects the voltage of each cell C and transmits the detected voltage to the controller 22. The voltage detection circuit 21 may be configured to detect a voltage across the assembled battery 11. The BMS 13 may include other detectors in addition to the voltage detection circuit 21. Examples thereof include a current detector that detects a current flowing through the assembled battery 11 and a temperature detector that detects a temperature of the assembled battery 11. The BMS 13 may be configured to monitor states of the assembled battery 11 such as an internal resistance or a state of charge (hereinafter, referred to as SOC) based on the detection results.

The controller 22 includes a central processing unit (hereinafter, referred to as a CPU) 22A and a memory 22B. The controller 22 and the voltage detection circuit 21 are activated when power is supplied from the assembled battery 11. The controller 22 is configured to switch a power consumption mode of the BMS 13 among a normal mode, a sleep mode, and a deep sleep mode. In these modes, the BMS 13 consumes power supplied by the assembled battery 11 at different levels. In other words, the controller 22 has a power saving function or a power switching function.

The normal mode is an example of a first power consumption mode of the BMS 13 while the vehicle is driving. In normal mode, the power is supplied from the assembled battery 11 to the voltage detection circuit 21, the controller 22, and the communication unit 24. This enables the BMS 13 to monitor the state of the assembled battery 11 such as a voltage of the cell C.

The sleep mode is another example of the first power consumption mode of the BMS 13 in which the BMS 13 consumes less power than in normal mode. The BMS 13 is in this power consumption mode while the vehicle is parked and the engine 2 is stopped. Like in the normal mode, in the sleep mode, the power is supplied from the assembled battery 11 to the voltage detection circuit 21, the controller 22, and the communication unit 24. This enables the BMS 13 to monitor the state of the assembled battery 11. However, in the sleep mode, the BMS 13 monitors the voltage of the cells C in a longer cycle than in the normal mode, for example, by lowering a clock frequency of the controller 22.

The deep sleep mode is an example of a second power consumption mode. In deep sleep mode, the BMS 13 consumes much less power than in the sleep mode. In the deep sleep mode, the power is supplied from the assembled battery 11 to none of the voltage detection circuit 21, the controller 22, and the communication unit 24. This does not enable the BMS 13 to monitor the state of the assembled battery 11.

The memory 22B stores various programs for controlling the operation of the controller 22 (including programs for executing a power control process, which will be described later). The CPU 22A controls each unit of the controller 22 in accordance with the program that is read out of the memory 22B. The memory 22B includes RAM or ROM. Other than the RAM or the ROM, the programs may be stored in a non-volatile memory such as CD-ROM, a hard disc device, or a flush memory.

The activation switch 23 is an electrical switch such as an FET. The switch 23 applies activation signal SG1 to a built-in switch, which is not illustrated, of the controller 22 based on an input through an operation by the user. Upon receiving the activation signal SG1 while the power consumption mode is in the deep sleep mode, the controller 22 turns on the built-in switch and the current starts to flow. Then, the assembled battery 11 starts to supply the power again and the power consumption mode of the BMS 13 is back in the normal mode or the sleep mode. In this embodiment, the activation switch 23 is an example of a receiver and the input through an operation by the user is an example of external input.

The communication unit 24 receives signals SG2 to SG5, which will be described later, from the ECU 4 and inputs the signals SG2 to SG5 to the CPU 22A. The equalization circuits 25 are connected in parallel to the respective cells C and each include a switching element 25A and a discharge resistance 25B. The controller 22 closes the switching element 25A of each equalization circuit 25 to discharge the power of the cell C, which is connected in parallel to the equalization circuit 25, through the discharge resistance 25B.

Power Control Process

The controller 22 executes the power control process illustrated in FIG. 2A when the power from the assembled battery 11 is supplied thereto. The controller 22 determines whether the engine 2 is stopped (S1). The ECU 4 transmits a lock signal SG3, an accessory signal SG4, an ignition-on signal SG5, or an engine activation signal SG2 to the communication unit 24 according to a position of an ignition switch, i.e., a lock position, an accessory position, an ignition-on position, or a start position, respectively.

The controller 22 determines that the engine 2 is stopped if the signal received by the communication unit 24 is the lock signal SG3 or the accessory signal SG4. If the signal received by the communication unit 24 after the engine activation signal SG2 is the ignition-on signal SG5, the controller 22 determines that the engine 2 is running. If the battery 1 is installed in an idling stop vehicle, the engine 2 of which is temporary stopped during driving, the controller 22 may be configured to determine that the engine 2 is stopped or determine that the engine 2 is running because the stop is temporary when the communication unit 24 receives an engine temporary stop signal from the ECU 4.

(1) Processes while Engine is Running

If the engine 2 is running (NO in step S1), the controller 22 switches the power consumption mode of the BMS 13 to the normal mode (S2). Specifically, if the BMS 13 is in the normal mode, the controller 22 maintains the normal mode, and if the BMS 13 is in another mode, the controller 22 switches the mode to the normal mode. In the normal mode, the relay 12 is usually in the closed state.

The ECU 4 executes a charge control if the SOC of the assembled battery 11 decreases to the level that corresponds to a charge start SOC, at which the charging of the assembled battery 11 is started, while the engine 2 is running. In the charge control, the assembled battery 11 is charged by the power generated by the alternator 6 and the charging ends when the SOC reaches a level that corresponds to a charge stop SOC (about 99%). As illustrated in FIG. 3, in the iron phosphate lithium ion battery, a region of about 75% to about 100% of SOC is a flat region (plateau) in which a change rate of an open circuit voltage (hereinafter, referred to as OCV) is relatively low, and it is difficult to accurately estimate an SOC from the OCV. In contract, a region of about 55% to 70% of SOC is a variation region in which the change rate of the OCV is higher than the flat region, and an SOC can be accurately estimated from the OCV. In this embodiment, the charge start SOC is set at about 60% (refer to a charge control region in FIG. 3).

The controller 22 executes an overcharge protection process (S3 to S6) after the controller 22 switches the power consumption mode of the BMS 13 to the normal mode. In the overcharge protection process, based on a detection result of the voltage detection circuit 21, the controller 22 determines whether a cell voltage Vc of at least one of the cells C is higher than an overcharge threshold Vth2 (S3). If cell voltages Vc of all the cells C are lower than the overcharge threshold Vth2 (NO in step S3), the cells C are in a normal state, and the controller 22 returns to step S1. If the controller 22 determines that the cell voltage Vc of at least one of the cells C is equal to or higher than the overcharge threshold Vth 2 (YES in step S3), the at least one cell C is in an overcharged state, and the controller 22 proceeds to the next overcharge protection steps (S4 to S6).

The controller 22 switches the state of the relay 12 to the open state to stop the charge by the alternator 6 (S4), and executes equalization (S5). The controller 22 closes the switch element 25A of the equalization circuit 25 that is connected in parallel to the cell C that is in the overcharged state to reduce the cell voltage Vc thereof to the same level as the cell voltage Vc of the other cells C.

After the equalization, the controller 22 executes a return process to switch the state of the relay 12 to the closed state again (S6). Then, the controller 22 returns to step S1. In this configuration, the relay 12 can be used for the overcharge protection. The ECU 4 preferably supplies the power generated by the alternator 6 to the on-vehicle device 5 or other devices while the relay 12 is opened. The controller 22 may execute the equalization (S5) before step S4, or may not execute the equalization (S5).

(2) Processes while Engine is Stopped

In step S1, if the controller 22 determines that the engine 2 is stopped (YES in step S1), the controller 22 switches the power consumption mode of the BMS 13 to the sleep mode (S7). Specifically, if the BMS 13 is in the sleep mode, the controller 22 maintains the sleep mode, and if the BMS 13 is in the other mode, the controller 22 switches the mode to the sleep mode. Like in the normal mode, in the sleep mode, the relay 12 is usually in the closed state. This allows the power supply from the assembled battery 11 to the on-vehicle device 5 or other devices, but the assembled battery 11 is not charged. Accordingly, the SOC decreases due to self-discharge, power consumption by the BMS 13 or the on-vehicle device 5, or the dark current.

In this step, variations in the cell voltages Vc of the cells C are relatively small because the engine 2 is stopped and the BMS 13 is in the sleep mode. Therefore, the cell voltages Vc are substantially in proportion to the OCV. Accordingly, the controller 22 can estimate the OCV or the SOC of each cell based on the cell voltage Vc of each cell C.

After the controller 22 switches the power consumption mode of the BMS 13 to the sleep mode, based on the detection result of the voltage detection circuit 21, the controller 22 determines whether the cell voltage Vc of at least one of the cells C is equal to or lower than a power-saving threshold Vth1 (an example of a low power threshold and an opening threshold) (S8). The power-saving threshold Vth1 is larger than an engine activation low-threshold Vth3. Specifically, the power-saving threshold Vth1 is obtained by adding a predetermined value to the engine activation low-threshold Vth3. The engine activation low-threshold Vth3 is an OCV that corresponds to the lowest level of the SOC at which the engine 2 can be started (the lowest SOC). For example, the predetermined value is less than 1.0 V, less than 0.5 V, or less than 0.1 V.

The controller 22 may be configured to determine whether the cell voltage Vc of each of the cells C is equal to or lower than the power-saving threshold Vth1, or whether a lowest cell voltage of the cell voltages Vc of the cells C is equal to or lower than the power-saving threshold Vth1. The controller 22 may be configured to determine whether the cell voltage Vc of at least one of the cells C is between the power-saving threshold Vth1 and the engine activation low-threshold Vth3. In addition, the controller 22 may be configured to determine whether the total voltage of the assembled battery 11 (the total of the cell voltages Vc of all the cells C), instead of the cell voltage Vc of each cell C, is lower than the opening threshold in step S8.

Figure 3:
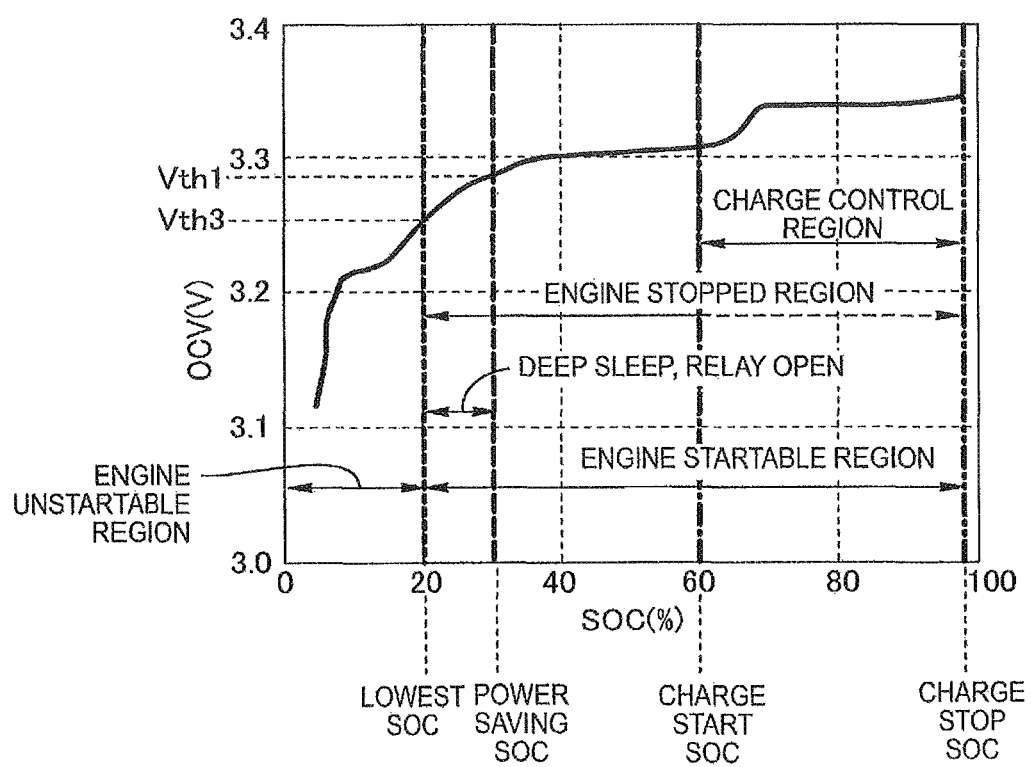
FIG. 3 is a graph illustrating SOC-OCV characteristics of an iron phosphate lithium ion battery.

As indicated in FIG. 3, in an engine startable region (20% to 100% of SOC) of the iron phosphate lithium ion battery, the region of about 40% to 50% of the SOC is the flat region, and the region of about 20% to 35% of the SOC is the variation region. The power-saving threshold Vth1 is preferably set in this variation region. In this embodiment, the power-saving threshold Vth1 is set at the OCV (about 3.28 V) that corresponds to about 30% of the SOC. Hereinafter, such an SOC is referred to as the power saving SOC.

In step S8, if the controller 22 determines that the cell voltages Vc of all the cells C are higher than the power-saving threshold Vth1 (NO in step S8), the SOC of each cell C is at a level at which the engine 2 can be started. Then, the controller 22 returns to step S1. In contrast, if the controller 22 determines that the cell voltage Vc of at least one of the cells C is equal to or lower than the power-saving threshold Vth1 (YES in step S8), the SOC of the cell C may be close to the lowest SOC at which the engine 2 cannot be started. Therefore, the controller 22 switches the state of the relay 12 to the open state and switches the power consumption mode of the BMS 13 to the deep sleep mode (S9). Accordingly, the power is not supplied from the assembled battery 11 to the controller 22 and the communication unit 24.

In step S9, the timing of the opening of the relay 12 and the timing of switching the power consumption mode of the BMS 13 to the deep sleep mode may be or may not be the same. For example, the controller 22 may switch the power consumption mode of the BMS 13 to the deep sleep mode after the opening of the relay 12.

When step S9 is performed, the power supply from the assembled battery 11 to the on-vehicle device 5 or other devices stops. With this configuration, the power consumption of the assembled battery 11 is reduced. As a result, after the cell voltage Vc becomes equal to or lower than the power saving threshold Vth1, the SOC of the cell C decreases toward the lowest SOC more slowly than that of a cell in a battery with a configuration in which step S9 is not performed. In other words, the SOCs of the cells C remain in the engine startable region for a longer period of time and the battery hardly runs out.

Since the ECU 4 executes the charge control as described above, the SOC of the assembled battery 11 is not always maintained at about 100% during the driving of the vehicle. In some cases, the SOC may decrease to about 60% immediately after the engine 2 is stopped (refer to an engine stopped region in FIG. 3, in which a vehicle is parked). Accordingly, the battery 1 of this embodiment is particularly useful compared to the configuration in which the ECU 4 always charges the assembled battery 11 to full capacity during the driving of the vehicle.

Experiments were conducted under the following conditions: the power consumption of the assembled battery 11 due to the self-discharge was about 1 mA/day in terms of current; the power consumption of the BMS 13 in the sleep mode was about 1 mA/day in terms of current; and the power consumption of the on-vehicle device 5 was about 15 mA/day in terms of current. Further, the SOC at the time when the engine 2 was stopped was 60%, the SOC corresponding to the power-saving threshold Vth1 was 30%, and the lowest SOC was 20%. In a comparative example in which a controller did not execute the processes in step S9, the SOC of the cell C decreased to the lowest SOC on 47th day after the engine 2 was stopped. In contrast, the controller 22 of this embodiment executed step S9 on about 35th day after the engine 2 was stopped, and then the SOC of the cell C decreased to the lowest SOC on about 114th day. As apparent from this example, the SOC of the cell C in this embodiment took a longer time to reach the lowest SOC by more than 100 days than the comparative example without the processes in S9.

In the iron phosphate lithium ion battery, if the SOC of the cell C is in an engine unstartable region (for example, 0% to 20% of SOC, refer to FIG. 3), the battery goes dead, and if the SOC is lower than 0, the battery may not be reused. Step S8 and step S9 are examples of the opening process and the power saving process. The SOC in the engine unstartable region or other regions differ depending on types of vehicle or environments.

If the activation switch 23 is turned on when the BMS 13 is in the deep sleep mode and the power is not supplied to the controller 22, the current starts flowing through the controller 22 and the power is supplied from the assembled battery 11 to the controller 22 again. The controller 22 executes an activation process illustrated in FIG. 2B. The engine 2 is more likely to start shortly after the activation switch 23 of the battery is turned on, and thus the controller 22 switches the state of the relay 12 back to the closed state and switches the power consumption mode of the BMS 13 back to the sleep mode (S11).

In step S11, the timing of the closing the relay 12 and the timing of the switching back of the BMS 13 to the sleep mode may be or may not be the same. For example, the controller 22 may switch the state of the relay 12 to the closed state after switching the power consumption mode of the BMS 13 back to the sleep mode.

The processes in step S11 allow the assembled battery 11 to be back in the state that can supply the power to the on-vehicle device 5 and allow the BMS 13 to be back in the state that can monitor the assembled battery 11 before the engine 2 starts. In other words, even if the BMS 13 is in the deep sleep mode and not monitoring the assembled battery 11, upon receiving the return instruction, the BMS 13 can be back in the sleep mode or the other mode that can monitor the assembled battery 13. Accordingly, while the vehicle is parked, the BMS 13 can be in the deep sleep mode to reduce the power consumption without any problems.

Subsequently, the controller 22 determines whether the engine 2 is started in a period between when the mode of the BMS 13 is switched back to the sleep mode or the other mode and when waiting time (an example of reference closing time or reference power time) is completed (S12). If the controller 22 receives the engine activation signal SG2 before the waiting time is completed, the controller 22 determines that the engine 2 is started (YES in step 12) and the controller 22 returns to step S1 in FIG. 2A. Then, the controller 22 proceeds to step S2, and thus the assembled battery 11 is charged by the alternator 6.

If the controller 22 does not receive the engine activation signal SG2 by the end of the waiting time, the controller 22 determines that the engine 2 is not started (NO in step S12). The controller 22 switches the state of the relay 12 to the open state again and switches the power consumption mode of the BMS 13 to the deep sleep mode again (S13). With this configuration, the power provided by the assembled battery 11 is less likely to be continuously consumed by the on-vehicle device 5 or the BMS 13 because the relay 12 does not remain in the closed state for a long time while the engine 2 is not started after the relay 12 is switched back to the closed state. Therefore, the battery 1 is less likely to be dead.

Effects

According to this embodiment, the battery 1 includes the relay 12 and the BMS 13 therein in addition to the assembled battery 11. The BMS 13 controls the opening and the closing of the relay 12. With this configuration, the battery 1 can control itself independently from systems installed in a vehicle body, i.e., systems other than BMS 13 in the vehicle, so as not to run out. In comparison to a configuration in which the relay 12 is provided in anywhere in the vehicle other than inside the battery 1, the relay 12 is less likely to be out of control due to communication errors between the battery 1 and the other system.

Other Embodiments

The present invention is not limited to the embodiment described above and illustrated in the drawings. The following various embodiments are also included in the technical scope of the present invention.

The electric storage device is not limited to the electric storage device that includes the cells connected in series, but may be an electric storage device that includes cells connected in parallel. The number of the cells may suitably be changed. The electric storage device is not limited to the assembled battery 11, but may include a single cell. The electric storage device is not limited to the iron phosphate lithium ion battery that has a graphite anode. The electric storage device may be other non-aqueous electrolyte secondary batteries such as a manganese lithium ion battery, or other batteries than the non-aqueous electrolyte secondary battery such as a lead electric storage battery or a nickel metal hydride battery. Further, the electric storage device is not limited to the secondary battery, but may be a capacitor. The electric storage device may be any battery that is used to start an engine of a machine provided with an engine (internal combustion engine, for example) as a driving source. For example, the machine may be an aircraft or a machine tool in addition to the vehicle.

The second power consumption mode may be a mode in which the assembled battery 11 supplies the power to at least one of the voltage detection circuit 21, the controller 22, and the communication unit 24. For example, in the deep sleep mode, the power may be supplied to the controller 22 and the communication unit 24, and the power may not be supplied to the voltage detection circuit 21. In such a case, the controller 22 may stop the monitoring of the voltage of the cell C and stop the opening or closing of the relay 12, and may be only capable of determining whether the communication unit 24 receives the input signal from outside. The controller 22 may switch the power consumption mode of the BMS 13 back to the sleep mode or the normal mode when the communication unit 24 receives the input signal.

Specifically, if the power is supplied from a power source other than the assembled battery 11 to the ECU 4 and the ECU 4 can output the signals such as the ignition-on signal SG5 to the communication unit 24 with the relay 12 in the open state, the controller 22 can determine that the return instruction is received when the communication unit 24 receives the ignition-on signal SG5. The engine 2 is more likely to start when a driver turns the ignition switch to the ignition-on position. In this configuration, the communication unit 24 is an example of a receiver. The communication unit 24 may be configured to receive the return instruction via wire communication or via wireless communication. For example, the communication unit 24 may be configured to receive the return instruction based on radio transmissions from a remote control switch operated by the driver. The controller 22 may determine that the return instruction is received upon receiving the accessory signal SG4.

In the above configuration in which the power can be supplied to the controller 22 and the communication unit 22 in the deep sleep mode, in step S9, the controller 22 may switch the state of the relay 12 to the open state after the controller 22 switches the power consumption mode of the BMS 13 to the deep sleep mode. Further, in step S11, the controller 22 may switch the power consumption mode of the BMS 13 back to the sleep mode or the normal mode after the controller 22 switches the state of the relay 12 back to the closed state.

In the above configuration in which the power can be supplied to the controller 22 and the communication unit 22 in the deep sleep mode, the waiting time may be set longer for the case where the controller 22 receives the activation signal SG1 than for the case where the controller 22 receives the ignition-on signal SG5 or the accessory signal SG4. This is based on the assumption that a longer time is required if the controller 22 receives the activation signal SG1, because, after turning on the activation switch 23 of the battery 1, the driver needs to come back from the position where the battery 1 is installed to the driver's seat to turn the ignition switch to the start position.

As described above, the receiver may be configured to receive the return instruction based on the input signal from the communication unit 24, or may be configured to receive the return instruction based on the human-operated input using the activation switch 23. The activation switch 23 may be a mechanical switch and may be configured to be switched between the open state and closed state by an operation of the user. When the activation switch 23 is switched to the closed state, the power starts to be supplied from the assembled battery 11 to the controller 22 again, and the power consumption mode of the BMS 13 is switched back to the normal mode or the sleep mode.

In the above embodiment, the controller 22 including one CPU 22A and the memory 22B is described as an example of a controller. However, the controller is not limited to this. The controller may include a plurality of CPUs or may include a hard circuit such as an ASIC (Application Specific Integrated Circuit) or may include both of the hard circuit and the CPU. For example, the controller may execute some processes or all of the processes of the power control process by different CPUs or hard circuits. The order of the steps in FIGS. 2A, 2B may be suitably changed.

In the above embodiment, the low power threshold or the opening threshold are the same power-saving threshold Vth1. However, the present technology is not limited to this. The low power threshold and the opening threshold may differ from each other. Specifically, in step S8 and step S9, the controller 22 may compare the cell voltage Vc of each cell C to the opening threshold in addition to the power-saving threshold Vth1. The controller 22 may be configured to switch the power consumption mode of the BMS 13 to the deep sleep mode when determining that at least one of the cells C has the cell voltage Vc that is lower than the power-saving threshold Vth1, and to switch the state of the relay 12 to the open state when determining that at least one of the cells C has the cell voltage Vc that is lower than the opening threshold.

In the above embodiment, the reference closing time and the reference power time are the same waiting time. However, the present technology is not limited to this. The reference closing time and the reference power time may differ from each other. Specifically, in step S12 and step S13, the controller 22 may determine whether a first waiting time and a second waiting time that are different from each other elapse from the time when the BMS 13 is back in the sleep mode or the other mode. If the controller 22 determines that the engine 2 does not start by the end of the first waiting time, the controller 22 may switch the state of the relay 12 to the open state again. If the controller 22 determines that the engine 2 does not start by the end of the second waiting time, the controller 22 may switch the power consumption mode of the BMS 13 to the deep sleep mode again.

The controller 22 may be configured to determine whether the engine 2 is stopped based on the voltage or the current of the assembled battery 11 in step S1. For example, the controller 22 may determine that the engine 2 is stopped if the controller 22 determines that a variation amount of the voltage of the assembled battery 11 continues to be lower than a reference value for a predetermined time.

In the above embodiment, in S8 or other steps, the controller 22 determines about the SOC based on the voltage Vc of the cell C. However, the present technology is not limited to this. The controller 22 may determine about the SOC based on a variable element that has a correlation with the SOC. For example, the variable element is a current accumulated amount that is obtained by integrating charge and discharge currents over time. In other words, the controller 22 may have any configuration that can execute the process in step S8 based on the variation value corresponding to the amount of charge of the assembled battery 11.

The controller 22 may not be configured to switch the power consumption mode of the BMS 13 to the sleep mode in step S9. Even in such a configuration, the BMS 13 consumes less power of the assembled battery 11.

What is claimed is:
1. A battery, comprising:
   an output terminal;
   an electric storage device;
   a monitoring apparatus including a detector and a controller, the detector being configured to detect a variation value corresponding to an amount of charge of the electric storage device;
   a relay connected to the output terminal and the electric storage device; and
   a communication unit connected to the controller,
   wherein the controller is configured to execute an opening process to switch a state of the relay from a closed state to an open state and to cause the communication unit to receive an input signal from outside.

2. The battery according to claim 1, wherein the controller is further configured to:
   switch a power consumption mode of the monitoring apparatus between a first power consumption mode, in which the monitoring apparatus monitors the electric storage device, and a second power consumption mode, in which the monitoring apparatus consumes less power supplied from the electric storage device than in the first power consumption mode.

3. The battery according to claim 2, wherein the controller is further configured to:

determine whether the variation value detected by the detector is lower than a low power threshold.

4. The battery according to claim 3, wherein the controller is further configured to:
execute a power saving process to switch the power consumption mode of the monitoring apparatus from the first power consumption mode to the second power consumption mode if the variation value is equal to or lower than the low power threshold.

5. The battery according to claim 4, further comprising a receiver configured to receive a return instruction based on an external input,
wherein the controller is further configured to execute a return process to switch the power consumption mode of the monitoring apparatus from the second power consumption mode back to the first power consumption mode if the receiver receives the return instruction.

6. The battery according to claim 5, wherein the controller is further configured to execute a closing process to switch the state of the relay from the open state back to the closed state if the controller executes the return process to switch the power consumption mode of the monitoring apparatus back to the first power consumption mode.

7. The battery according to claim 6, wherein the controller is further configured to:
determine whether an engine is started in a period between when the state of the relay is switched back to the closed state and when a reference closing time is completed.

8. The battery according to claim 7, wherein the controller is further configured to:
execute a re-opening process to switch the state of the relay from the closed state to the open state again if the engine is determined to not be started.

9. The battery according to claim 5, wherein the controller is further configured to:
determine whether an engine is started in a period between when the power consumption mode is switched back to the first power consumption mode and when a reference power time is completed.

10. The battery according to claim 9, wherein the controller is further configured to:
execute a re-power saving process to switch the power consumption mode of the monitoring apparatus back to the second power consumption mode if the engine is determined to not be started.

11. The battery according to claim 1, wherein the controller is further configured to:
determine whether a voltage of the electric storage device exceeds an overcharge threshold based on the variation value detected by the detector.

12. The battery according to claim 11, wherein the controller is further configured to:
execute an overcharge protection process to switch the state of the relay from the closed state to the open state if the voltage of the electric storage device exceeds the overcharge threshold.

13. The battery according to claim 1, wherein the electric storage device comprises an iron phosphate lithium ion battery that includes a graphite anode.

14. The battery according to claim 1, wherein the relay comprises a latching relay.

15. The battery according to claim 1, wherein the detector includes:
a voltage detection circuit that detects a voltage of the electric storage device;
a current detector that detects a current flowing through the electric storage device; and
a temperature detector that detects a temperature of the electric storage device.

16. The battery according to claim 1, further comprising a receiver configured to receive a return instruction based on a remote transmission from a remote control switch,
wherein the controller is further configured to execute a return process to switch the state of the relay from the open state back to the closed state if the receiver receives the return instruction.

17. The battery according to claim 1, further comprising a receiver configured to receive a return instruction based on an ignition-on signal,
wherein the controller is further configured to execute a return process to switch the state of the relay from the open state back to the closed state if the receiver receives the return instruction.

18. A power control method of a battery that includes an output terminal, an electric storage device, a monitoring apparatus including a detector and a controller, and a relay connected to the output terminal and the electric storage device, the method comprising:
detecting a variation value corresponding to an amount of charge of the electric storage device; and
executing, by the controller, an opening process to switch a state of the relay from a closed state to an open state, and to cause the communication unit to receive an input signal from outside.

19. The power control method according to claim 18, wherein the controller is configured to switch a power consumption mode of the monitoring apparatus between a first power consumption mode, in which the monitoring apparatus monitors the electric storage device, and a second power consumption mode, in which the monitoring apparatus consumes less power supplied from the electric storage device than in the first power consumption mode.

20. The power control method according to claim 19, wherein the controller is further configured to execute a power saving to switch the power consumption mode of the monitoring apparatus from the first power consumption mode to the second consumption mode based on a comparison of the variation value to a power threshold.

* * * * *